(12) United States Patent
Bollenbeck et al.

(10) Patent No.: US 11,874,352 B2
(45) Date of Patent: Jan. 16, 2024

(54) APPARATUS AND METHOD FOR TRANSFERRING CLOCK SIGNALS FROM A MAGNETIC RESONANCE TOMOGRAPHY UNIT TO A PERIPHERAL DEVICE

(71) Applicant: Siemens Healthcare GmbH, Erlangen (DE)

(72) Inventors: Jan Bollenbeck, Bayern (DE); Peter Speier, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/844,914

(22) Filed: Jun. 21, 2022

(65) Prior Publication Data
US 2022/0413073 A1 Dec. 29, 2022

(30) Foreign Application Priority Data

Jun. 23, 2021 (DE) ...................... 10 2021 206 483.3
Jun. 23, 2021 (DE) ...................... 10 2021 206 487.6

(51) Int. Cl.
*G01R 33/48* (2006.01)
*G01R 33/36* (2006.01)

(52) U.S. Cl.
CPC ....... *G01R 33/482* (2013.01); *G01R 33/3621* (2013.01)

(58) Field of Classification Search
CPC .............. G01R 33/482; G01R 33/3621; G01R 33/3692
See application file for complete search history.

(56) References Cited

U.S. PATENT DOCUMENTS

| 6,961,604 | B1 | 11/2005 | Vahasalo et al. |
| 7,173,426 | B1* | 2/2007 | Bulumulla ......... G01R 33/3415 |
| | | | 324/318 |
| 8,643,362 | B2 | 2/2014 | Sekiguchi et al. |
| 9,813,149 | B2 | 11/2017 | Bollenbeck |
| 10,393,845 | B2* | 8/2019 | Schröter ............ G01R 33/3614 |
| 2007/0182409 | A1 | 8/2007 | Varjo |

(Continued)

FOREIGN PATENT DOCUMENTS

| EP | 1810047 A1 | 7/2007 |
| WO | 2014203943 A1 | 12/2014 |

(Continued)

OTHER PUBLICATIONS

Nohava, Lena, et al. "Perspectives in wireless radio frequency coil development for magnetic resonance imaging." Frontiers in Physics 8 (2020): 1-10.

(Continued)

*Primary Examiner* — G. M. A Hyder
(74) *Attorney, Agent, or Firm* — Lempia Summerfield Katz LLC (57) ABSTRACT

A peripheral device for a magnetic resonance tomography unit. The peripheral device includes a first sensor for receiving an electromagnetic data signal from the environment of the peripheral device. The peripheral device is configured to execute signal processing in dependence on the electromagnetic data signal and a frequency of the electromagnetic data signal is greater than a Larmor frequency of the magnetic resonance tomography unit.

12 Claims, 7 Drawing Sheets

(56) References Cited

U.S. PATENT DOCUMENTS

| | | |
|---|---|---|
| 2009/0267601 A1 | 10/2009 | Van Helvoort |
| 2010/0117649 A1 | 5/2010 | Nakanishi et al. |
| 2013/0342198 A1 | 12/2013 | Vester |
| 2016/0069969 A1 | 3/2016 | Tomiha et al. |
| 2016/0109541 A1 | 4/2016 | Hayakawa et al. |
| 2016/0169991 A1 | 6/2016 | Kato et al. |
| 2017/0082706 A1 | 3/2017 | Soejima |
| 2018/0106875 A1 | 4/2018 | Duensing et al. |
| 2018/0299522 A1 | 10/2018 | Biber et al. |
| 2018/0376441 A1 | 12/2018 | Reykowski et al. |

FOREIGN PATENT DOCUMENTS

| | | |
|---|---|---|
| WO | 2015197720 A1 | 12/2015 |
| WO | 2016157039 A1 | 10/2016 |
| WO | 2017103759 A2 | 6/2017 |

OTHER PUBLICATIONS

Wikipedia "Distance Law" Retrieved Dec. 13, 2021. pp. 1-2. https://de.wikipedia.org/wiki/Abstandsgesetz.

Wikipedia "Photodiode" Retrieved May 27, 2022. pp. 1-5. https://en.wikipedia.org/wiki/Photodiode.

* cited by examiner

APPARATUS AND METHOD FOR TRANSFERRING CLOCK SIGNALS FROM A MAGNETIC RESONANCE TOMOGRAPHY UNIT TO A PERIPHERAL DEVICE

CROSS REFERENCE TO RELATED APPLICATIONS

This application claims the benefit of DE 102021206483.3 filed on Jun. 23, 2021, and DE 102021206487.6 filed on Jun. 23, 2021, both of which are hereby incorporated by reference in their entirety.

FIELD

Embodiments relate to an apparatus for transferring a clock signal and/or control signal from a magnetic resonance tomography unit to a peripheral device.

BACKGROUND

Magnetic resonance tomography units are imaging apparatuses, that, for imaging an examination object, align nuclear spins of the examination object with a strong external magnetic field and excite them to precession about this alignment by an alternating magnetic field. The precession or return of the spins from this excited state into a state with lower energy in turn generates an alternating magnetic field as a response, that is received via antennas.

With the aid of magnetic gradient fields, spatial encoding is impressed on the signals, that subsequently enables the assignment of the received signal to a volume element. The received signal is then evaluated, and three-dimensional imaging representation of the examination object is provided. The signal may be received by using local receiving antennas, so-called local coils, that are arranged directly on the examination object in order to achieve a better signal-to-noise ratio.

Peripheral or accessory devices with no direct interface to the MRT system, for example, communication devices, music/video entertainment devices, patient monitors for monitoring vital signs, cameras, motor-driven mobile couches are increasingly being operated inside the shielding booths of MRT systems. Signal processing within the devices is usually clocked with signals from free-running oscillators. The clock signals do not run synchronously with the system clock of the MR system.

Since MRT systems have very sensitive receiving systems, that, due to the use of multi-dimensional Fourier analysis techniques, make continuous interference signals particularly prominent, it is potentially easy for artifacts to occur in the imaging. This interference may arise when harmonics of the clock signals fall spectrally either directly into receiving regions of the MRT system or appear in a receiving region or an alias band of the analog-to-digital conversion due to intermodulation with further signals that are, at least occasionally, continuous. In addition, methods for generating movement information, for example, pilot tone methods, may be disrupted by harmonics of the clock signals.

An additional problem is that the accessory devices cannot be controlled from outside the shielding booth, for example, via the user interface of the magnetic resonance tomography unit.

BRIEF SUMMARY AND DESCRIPTION

The scope of the present disclosure is defined solely by the appended claims and is not affected to any degree by the statements within this summary. The present embodiments may obviate one or more of the drawbacks or limitations in the related art.

Embodiments provide peripheral devices and a magnetic resonance tomography unit enabling improved image acquisition.

The peripheral device includes a first sensor for receiving an electromagnetic data signal from the environment of the magnetic resonance tomography unit. An electromagnetic data signal is considered to be electromagnetic waves, including those up to the wavelength ranges of visible light.

Herein, the environment is considered to be the free space surrounding the magnetic resonance tomography unit, for example in a position appropriate for the application, for example, in the vicinity of the openings of the patient tunnel where operating personal are working or also in a patient tunnel with a patient. The distance in the environment is less than 10 m, 5 m, or 2 m from the magnetic resonance tomography unit. The environment is the inside of a shielding booth if there is one. For example, this does not mean a guided connection, such as a cable or an optical fiber between the peripheral device and the magnetic resonance tomography unit, but rather open-air transfer.

The first sensor converts the electromagnetic data signal into an electrical signal, that is further used in the peripheral device for signal processing in dependence on the electromagnetic data signal. Herein, the electromagnetic data signal transfers information from the magnetic resonance tomography unit to the peripheral device. The electromagnetic data signal may, for example, transfer a clock signal, that is the basis for signal processing in the peripheral device. Herein, the electromagnetic data signal has a frequency that is greater than a Larmor frequency of the magnetic resonance tomography unit for nuclear spins to be detected by the magnetic resonance tomography unit during image acquisition. This the Larmor frequency of hydrogen nuclei in a static magnetic field BO of the magnetic resonance tomography unit. Herein, a greater frequency may be considered to be a frequency that is more than twice, three times or ten times the frequency of the Larmor frequency. The electromagnetic data signal may, for example, be visible light or infrared light or a radio wave, for example in a license-free ISM band such as 2.4 GHz, 5.8 GHz, 24 GHz, or 61 GHz as a transfer medium. Herein, the information is modulated onto the transfer medium, for example by amplitude modulation. Herein, it is also conceivable for a carrier wave to be in turn modulated onto the transfer medium, onto which in turn a control signal or other information to be transferred is modulated. In an embodiment, for example, a clock signal is modulated onto the light or radio wave transfer medium. The clock signal is in turn modulated as a carrier wave with a control command or other information to be transferred.

The sensor may, for example, have an antenna for radio signals or a photodiode, a phototransistor, or another electronic element as a detector element for optical signals, or it may be a combination of electronic components, for example, with an amplifier, that converts the electromagnetic data signal into an electrical signal or sensor signal.

Advantageously, the peripheral device allows information for controlling the peripheral device to be transferred via the sensor without interference to magnetic resonance reception or cables that disrupt handling. For example, the fact that the frequency of the electromagnetic data signal is greater than the Larmor frequency ensures that no harmonic frequencies interfere with reception of the magnetic resonance signal.

The magnetic resonance tomography unit has a transmitter configured to transfer a clock signal and/or control signal wirelessly by the electromagnetic data signal to a peripheral device in an environment of the magnetic resonance tomography unit. The transmitter may, for example, have an oscillator and an antenna for a radio signal and a light source such as an LED or semiconductor laser for an optical data signal. Herein, a frequency of the electromagnetic data signal is greater than a Larmor frequency of the magnetic resonance tomography unit.

The optical transmitter is configured to transfer a clock signal and/or control signal to a local coil in an examination area of the magnetic resonance tomography unit by open-air optical transfer of an optical signal. For example, a clock signal may be amplitude-modulated as a carrier signal with a multiplier as a modulator with a data signal and then amplified and applied to an LED, that then emits an intensity-modulated optical signal with a clock and control signal as a data signal for the local coil. However, digital modulation by switching a light source, and thus the optical signal, on and off is also conceivable.

The information on the signals and frequencies given above for the peripheral device applies here analogously.

The following uses the terms first modulation frequency and second modulation frequency. In the case of analog modulation by, for example, a multiplier, herein the carrier signal to be modulated or the carrier frequency to be modulated corresponds to the first modulation frequency, that corresponds to the frequency of the clock signal to be transferred. In an embodiment explained below, frequency shift keying takes place between two widely spaced frequencies, that are therefore referred to as the first modulation frequency and second modulation frequency and do not strictly represent a carrier signal that is modulated. Herein, a signal with the respective frequency may also be referred to as the first or second modulation frequency.

Advantageously, in this way, a data signal may be transferred from the magnetic resonance tomography unit to the peripheral device without interfering with magnetic resonance reception.

Herein, in one possible embodiment of the peripheral device, the electromagnetic data signal is an optical data signal. Herein, an optical data signal is a signal in not only the wavelength range visible to the eye of 380 nm to 750 nm, but also in adjacent wavelength ranges such as ultraviolet between 150 nm and 380 nm or near infrared between 750 nm and 2000 nm. The energy of the light quanta may be greater than 0.8 eV.

Advantageously, optical signals are easy to generate and receive and, in the intensities used, are not subject to regulation so that no additional approval criteria need to be taken into account.

In an embodiment of the peripheral device, the peripheral device includes a second sensor adjacent to the first sensor. Herein, adjacent is considered to be a distance between the first sensor and the second sensor in which the electric and/or magnetic fields generated by the magnetic resonance tomography unit substantially have the same strength, so that interference caused by these in the first and the second sensor is substantially identical. The distance may, for example, be less than 2 mm, 5 mm, 1 cm or 5 cm. Herein, the sensors may be arranged or aligned such that an optical signal source in an environment of the peripheral device in a detector element of the first sensor and the second sensor achieves a substantially equal effect, for example with respect to strength or magnitude, for example, an approximately equal number of electron-hole pairs are generated in the two sensors.

The first sensor is configured to generate a first output signal from the optical data signal and the second sensor is configured to generate a second output signal from the same optical data signal. The first output signal has an amplitude that is inverted relative to the second output signal, in other words, the magnitude is substantially the same, but the sign is different. Herein, the output signal is considered with respect to or relative to a rest level or offset generated by the first sensor and the second sensor without the influence of an optical signal, for example, or as an AC component of a signal generated by the sensors with frequency components greater than 1 Hz, 100 Hz, 1 kHz, 100 kHz, or 1 MHz. Opposite signs may, for example, be achieved in that a photodiode in the first sensor is attached to the positive supply voltage and via a resistor to the negative supply voltage, while a photodiode in the second sensor is attached to the negative supply voltage and connected via a resistor to the positive supply voltage. The output signal with different signs is then in each case present at the connection points of the photodiodes with the resistors.

The peripheral device includes an inverter, that inverts the output signal from the first sensor, and a summing element, that is configured to add the inverted output signal from the first sensor and the output signal from the second sensor to a sensor signal. Inverting the signal may, for example, be achieved by an emitter circuit with a transistor.

Advantageously, output signals generated by optical signals are added by the inverse sign and the subsequent inversion with the same sign and thus amplified, while electrically and/or magnetically induced interference is ideally cancelled out by the simple inversion during the summation, so that the interference component in the sensor signal is substantially reduced.

In an embodiment of the peripheral device, the peripheral device includes a filter configured to select a carrier signal frequency or a first modulation frequency of the sensor signal. In other words, the filter has a local or global minimum of a pass-band attenuation for a predetermined carrier signal frequency. The filter attenuates a sensor signal with a frequency at a spacing of one octave or at a frequency equal to one-half or twice the carrier signal frequency versus attenuation at the modulation frequency by more than 24 dB, 30 dB or 36 dB. The filter may be a bandpass filter, but, for example, also a lowpass filter, depending on the frequency spectrum of the optical signal.

Furthermore, the peripheral device has a narrow-band phase-lock loop circuit (PLL circuit) configured to stabilize a stable oscillator, for example a crystal oscillator, in dependence on the carrier signal frequency. A narrow-band PLL circuit is considered to be a PLL circuit that locks in at a frequency deviation of less than 100 ppm, 10 ppm or 1 ppm from the oscillator's natural frequency.

Advantageously, a narrow-band PLL circuit is immune to interference and may provide an accurate clock signal even in the event of brief dropouts of the sensor signal.

In an embodiment of the peripheral device, the peripheral device includes an amplitude demodulator with a compensation circuit. The compensation circuit is configured to compensate a low-frequency signal component of the sensor signal compared to a modulation frequency of the modulation signal. A low-frequency component is considered to be a spectral component of the signal demodulated by the amplitude demodulator the frequency of which is less than 10%, 1% or one part per thousand of the modulation frequency. For example, low-frequency components are considered to be those caused by movements of the peripheral device during use or by external light sources and that are in the range below 200 Hz, 120 Hz or 60 Hz.

Intensity changes due to movement or shadowing are slow signal changes that, due to this frequency difference, may advantageously be separated from a clock frequency or a data signal by a compensation circuit and suppressed.

In an embodiment of the peripheral device, the compensation circuit has a differential amplifier connected as a comparator with a reference voltage input, that has a first signal connection to the sensor signal via an attenuator, for example in the form of a resistive voltage divider, in a series circuit with a low-pass filter. Herein, a comparator is considered to be a circuit that compares two input signals and provides a comparison result in the form of a controlled output voltage even if there is only a small difference between the input signals. In this sense, the comparator corresponds to a differential amplifier with high amplification. Herein, it is for example conceivable for the reference voltage input to be non-inverting and for the sensor signal or a signal proportional thereto to be applied to the inverting input of the differential amplifier.

Thus, only the low-frequency components in the sensor signal are applied to the non-inverting input of the differential amplifier as a comparator reference signal via the low-pass filter. In this way, the comparator reference signal advantageously follows slow changes, such as those caused, for example, by movement or shadowing. An upstream voltage divider reduces the voltage of the low-pass filtered reference signal so that it is below the sensor voltage without control signal transfer and the comparator output signal responds exclusively to the component in the sensor signal caused by the rapidly changing modulations signal.

In an embodiment of the peripheral device, the first signal connection has a track and hold element that is actuated in dependence on a differential voltage between the sensor signal and the reference voltage. For example, an electronic switch may be arranged between a source of the sensor signal and the low-pass filter.

Advantageously, the switch then disconnects the sensor signal path to the low-pass filter when the sensor signal voltage falls below the reference voltage due to the fast modulation; this keeps the reference voltage constant until the sensor signal voltage exceeds the reference signal again due to the modulation content.

The magnetic resonance tomography unit includes an optical transmitter with amplitude modulation. The optical transmitter is configured to transfer a clock signal and/or control signal by open-air optical transfer of an optical signal to a peripheral device in an environment or an examination area of the magnetic resonance tomography unit. For example, a clock signal may be amplitude-modulated as a carrier signal with a multiplier as an amplitude modulator with a data signal and then applied amplified to an LED, that then emits an intensity-modulated optical signal with a clock and control signal as a data signal for the peripheral device. However, digital modulation by switching a light source, and thus the optical signal, on and off is also conceivable. The information given for the corresponding peripheral device applies analogously to the optical signal.

Advantageously, optical signals are easy to generate and receive and, in the intensities used, are not subject to regulation so that no additional approval criteria need to be taken into account.

In an embodiment of the magnetic resonance tomography unit, the optical transmitter has an amplitude modulator. The amplitude modulator is configured to synchronously execute a light intensity change for modulation of the optical signal for the transfer of the clock signal and the control signal. For example, the amplitude modulator could have a sample and hold element or flip-flop that switches a change of the control signal with only one edge of the clock signal to a multiplier of the amplitude modulator. For example, here the amplitude modulator should be understood to be an apparatus configured also to set intermediate stages in the optical signal between the stages "off" without light emission and "on" with maximum intensity and thus differs from the switch for digital modulation described below.

Advantageously, synchronous modulation by the control signal means that the phase of the modulated clock signal is not changed and there is no interference to a PLL on the receiving side.

In an embodiment of the magnetic resonance tomography unit, the transmitter is configured to switch the optical signal on and off at a modulation frequency (amplitude shift keying or amplitude on/off keying) in order to transfer the control signal and the clock signal. The magnetic resonance tomography unit is configured to change a frequency of the modulation signal from a first modulation frequency to a second modulation frequency unequal to the first modulation frequency in order to transfer the control signal.

Since the intensity of the optical signal has a hard switchover in time with the modulation frequency, the light sensor supplies a square-wave sensor signal with a fundamental frequency corresponding to the first or second modulation frequency. In conjunction with a bandpass filter as part of the signal path for the sensor signal or another filter with frequency-dependent attenuation, a spectral component (harmonic or also fundamental frequency) of the square-wave signal is selected for further processing.

Changing the modulation frequency is much easier and more accurate to implement for nonlinear light sources, such as, for example, LEDs or semiconductor lasers, than direct control of the luminosity. Only the modulation frequency at which a switch turns the light source on and off is changed.

In an embodiment of the magnetic resonance tomography unit, a frequency of the clock signal is an odd multiple of the modulation frequency. For example, the clock signal may have a frequency of 10 MHz. The modulation frequency is then switched between a first modulation frequency and a second modulation frequency. The first modulation frequency in the example relates to 10 MHz and the second modulation frequency to a third thereof, i.e., the frequency of the clock signal is equal to the first modulation frequency multiplied by 1 and is equal to the second modulation frequency multiplied by 3. Herein, the modulation frequency is switched over in a phase-neutral manner, i.e., in the time frame of the clock frequency or first modulation frequency.

When the optical signal is modulated by switching it on or off, a square-wave signal is generated that has harmonics at odd multiples of the modulation frequency. Therefore, if the second modulation frequency is a third of the clock signal frequency, the third harmonic is at three times the modulation frequency or exactly at the frequency of the clock signal. Herein, a bandpass filter may be used to select the spectral component at the clock signal frequency and suppress or attenuate all further harmonics, for example by more than 24 dB, 30 dB or 36 dB. Therefore, a clock signal of, for example, 10 MHz is provided at both the first modulation frequency and the second modulation frequency. Herein, due to the phase-neutral switching between the two modulation frequencies, the phase of the transferred clock signal also remains unchanged, so that, for example, downstream PLL circuits supply a phase-stable output signal for the peripheral device. However, at the same time, in the case of a symmetrical square-wave signal with no direct component, the amplitude of the third harmonic is only a third as large as the amplitude of the fundamental wave (first harmonic), that, with frequency shift keying, results in amplitude modulation of the bandpass-filtered received signal between a third and the full amplitude. This amplitude modulation of the selected spectral component enables a control signal to be transferred, for example, to activate the peripheral device or to output a message to an operator. With a digital code transferred with this amplitude modulation, different control commands may be transferred, and, at the same time, a phase-stable clock signal may be provided. The modulation may be provided by a simple switch.

However, it is also conceivable that the first sensor 51 is not an optical sensor, but a receiver for radio waves for receiving the electromagnetic data signal. Herein, the radio waves take over the function of the light waves as a carrier signal for the first modulation frequency and the second modulation frequency. The sensor's output signal may then be generated by rectifying the received radio wave or an intermediate frequency derived therefrom. Herein, the frequency of the electromagnetic data signal, the intermediate frequency or the radio wave may be substantially higher than the first modulation frequency and the second modulation frequency, for example, by a factor of more than 10, 100 or 1000.

The method is provided for the wireless transfer of a clock signal and a control signal with a system including a magnetic resonance tomography unit and a peripheral. The method includes the step of modulating an electromagnetic data signal at a first modulation frequency and emitting the first modulated electromagnetic data signal. For example, an electronic switch may be used to switch an LED or a semiconductor laser on or off in time with the first modulation frequency, thereby generating and emitting an optical signal at the first modulation frequency. However, it is also conceivable that, in a transmitter, a radio-frequency signal with a frequency in the radio-wave range is switched on and off or is switched between two amplitude values and radiated via an antenna into an environment of the peripheral device as a radio wave.

In a further step, the electromagnetic data signal with the first modulation frequency is received by the first sensor and converted into an electrical signal.

The first sensor may, for example, be a photodiode that receives the optical signal and converts it into an electrical signal, that is also called the first output signal in the following. It is also conceivable for the electrical signal to be amplified and/or combined with electrical signals from other sensors.

However, the first sensor may also be a receiver for radio waves and output a first output signal that depends, for example proportionally, on the field strength of the radio signal.

In a further step, the first output signal from the first sensor is then filtered by the bandpass filter.

Similarly, in further steps, the electromagnetic data signal is modulated at a second modulation frequency different from the first modulation frequency, transmitted and received by the first sensor and bandpass filtered.

Herein, the output signal from the first sensor for the second modulation frequency is referred to as the third output signal since the term second output signal is already used for the output signal from the second sensor. In general, herein, the method is also conceivable with an output signal from the second sensor or with a combination of both output signals of both sensors for interference suppression.

Herein, there may be a phase-synchronous change between the first modulation frequency and second modulation frequency.

In a further step, a clock frequency of an oscillator is stabilized with the first output signal and the third output signal from the first sensor. In another step, a control signal is obtained from the first output signal and the third output signal by demodulation with an amplitude modulator.

Herein, an essential point for the steps is the characteristic that a frequency of the clock signal is an odd multiple of the modulation frequency. For example, the first modulation frequency may correspond to the clock frequency, that corresponds to a onefold multiple. The second modulation frequency could correspond to a third of the frequency of the clock signal so that the frequency of the clock signal corresponds to three times the second modulation frequency. Modulation by switching on and off produces a square-wave signal that has harmonics with frequencies corresponding to an odd multiple of the fundamental frequency. Therefore, a frequency component equal to the frequency of the clock signal is produced both at a first modulation frequency equal to the frequency of the clock signal and at a second modulation frequency equal to a third of the frequency of the clock signal. Herein, the bandpass filter in each case allows the frequency range of the clock signal to pass and suppresses other harmonics or the lower fundamental frequency. Therefore, a signal with a frequency of the clock signal is always available as the output signal from the sensor in order to stabilize an oscillator, for example by a PLL.

At the same time, however, the output signal has a different amplitude depending on the frequency of the modulator signal, since the harmonics have a lower amplitude than the fundamental wave. Shift keying between the two modulation frequencies enables an amplitude modulation to be imposed on the selected spectral component, that may then be demodulated by an amplitude demodulator and then decoded. Herein, with phase-synchronous shift keying between the modulation frequencies, there is no interference to the transferred clock signal.

DETAILED DESCRIPTION

Figure 1:
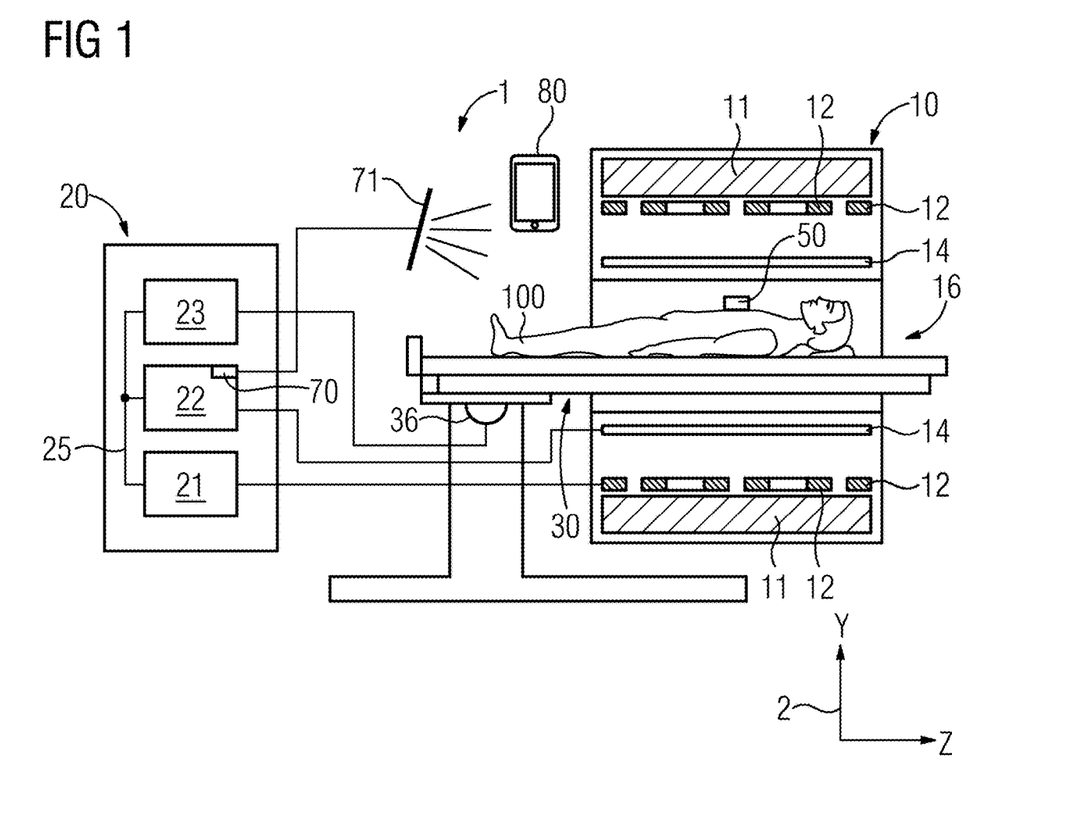
FIG. 1 depicts a schematic representation of a magnetic resonance tomography unit according to an embodiment.

FIG. 1 shows a schematic representation of an embodiment of a magnetic resonance tomography unit 1.

The magnet unit 10 includes a field magnet 11 that generates a static magnetic field BO for aligning nuclear spins of samples or of the patient 100 in a receiving area. The receiving area is characterized by an extremely homogeneous static magnetic field BO. The homogeneity for example relates to the magnetic field strength or magnitude. The receiving area is almost spherical and arranged in a patient tunnel 16, that extends in a longitudinal direction 2 through the magnet unit 10. A patient couch 30 may be moved in the patient tunnel 16 by the moving unit 36. The field magnet 11 is usually a superconducting magnet that is able to provide magnetic fields with a magnetic flow density of up to 3T, in the latest devices even more. However, for lower magnetic field strengths, it is also possible to use permanent magnets or electromagnets with normally conducting coils.

Furthermore, the magnet unit 10 includes gradient coils 12 that are configured to superimpose temporally and spatially variable magnetic fields in three spatial directions on the magnetic field BO in order to spatially differentiate the detected imaging areas in the examination volume. The gradient coils 12 are usually coils made of normally conducting wires that may generate mutually orthogonal fields in the examination volume.

The magnet unit 10 also includes a body coil 14 that is configured to radiate a radio-frequency signal supplied via a signal line into the examination volume and to receive resonance signals emitted by the patient 100 and output them via a signal line.

A control unit 20 supplies the magnet unit 10 with the different signals for the gradient coils 12 and the body coil 14 and evaluates the received signals.

Thus, the control unit 20 includes a gradient controller 21, that is configured to supply the gradient coils 12 via supply lines with variable currents that provide the desired gradient fields in a time coordinated manner in the examination volume.

Furthermore, the control unit 20 includes a radio-frequency unit 22, that is configured to generate a radio-frequency pulse with a predetermined time profile, amplitude, and spectral power distribution for exciting a magnetic resonance of the nuclear spins in the patient 100. Herein, pulse powers in the range of kilowatts may be achieved. The excitation signals may be radiated into the patient 100 via the body coil 14 or also via a local transmitting antenna.

A controller 23 communicates via a signal bus 25 with the gradient controller 21 and the radio-frequency unit 22.

The magnetic resonance tomography unit 1 is surrounded by a plurality of peripheral devices 80 or accessory devices that may be involved in the acquisition of a magnetic resonance image. These may be control elements, apparatuses for communicating with the patient or entertaining the patient or also sensors that acquire physiological parameters of the patient 100. By way of example, the peripheral device 80 shown here is a tablet for the user interface. It is also conceivable for the peripheral device 80 to be the local coil 50.

Many of these peripheral devices 80 contain digital circuits or processors whose clock signals and signals derived therefrom may generate interference. For example, signals below the clock frequency are also generated during signal processing, usually at frequencies that are integer fractions of the clock frequency and in turn have harmonics. However, with a suitable choice of clock frequency, it is possible to ensure that these interference signals lie between the useful frequencies of the signal or a subsequent signal processing path and do not cause interference. However, the clock frequencies must be sufficiently stable to ensure they do not migrate into interfering frequency ranges, for example due to temperature changes. Therefore, the magnetic resonance tomography unit 1 has a transfer apparatus for the wireless transfer of a clock signal, for example, the optical transmitter 70 shown in FIG. 1 or also a transmitter 73 for radio waves shown in FIG. 7. The clock signal may be derived from a stable master clock of the magnetic resonance tomography unit 1, that the control unit 20 provides to the optical transmitter 70 or the transmitter 73.

For the transfer to the peripheral device 80, the control unit 20 includes the optical transmitter 70, wherein the light emitters 71, that emit the light, are herein arranged in the environment of the magnetic resonance tomography unit such that they directly or indirectly illuminate the peripheral device 80. The magnetic resonance tomography unit includes multiple light emitters 71 that are spatially distributed or illuminate a light-scattering surface, so that shadowing of an optical signal emitted by the light emitters 71 at the peripheral device 80 is avoided. Herein, the light emitters 71 may be LEDs or semiconductor lasers, that receive an electrical signal from the optical transmitter 70 and convert it into the optical signal and emit it into the environment. However, it would also be conceivable that an LED emitter or semiconductor laser in the optical transmitter 70 already performs a conversion into light and this is guided via glass fibers and optionally optical splitters to radiation points in the environment.

Figure 2:
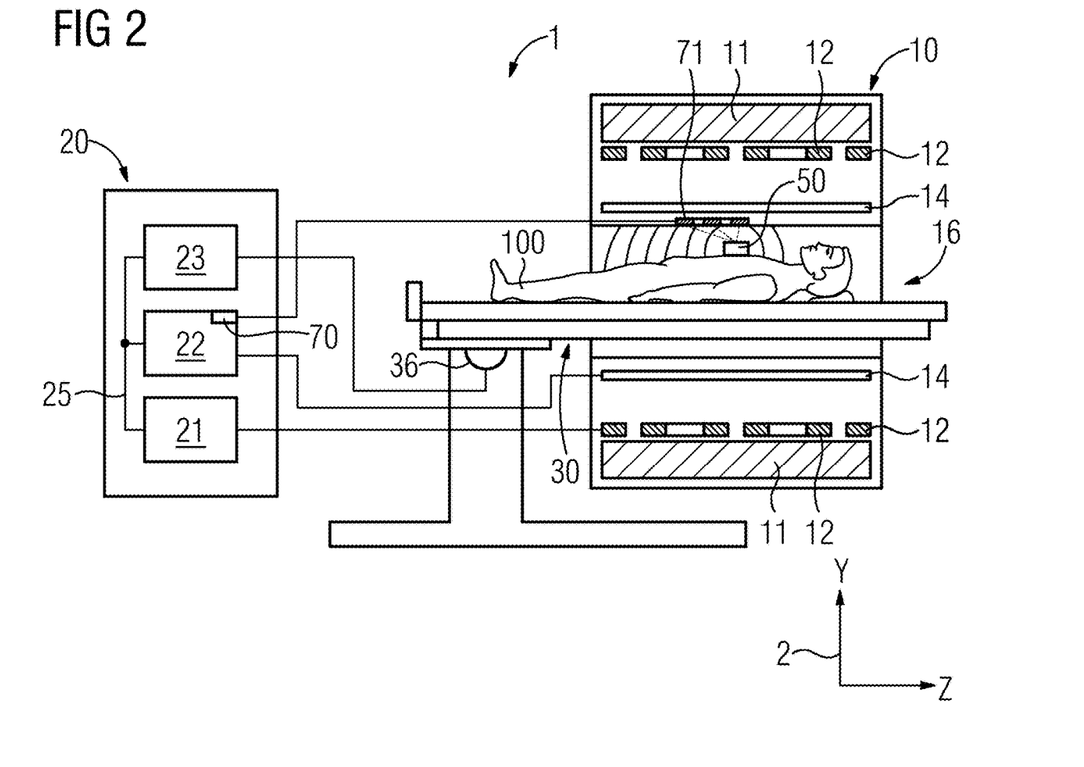
FIG. 2 depicts a schematic representation of a magnetic resonance tomography unit according to an embodiment.

FIG. 2 shows a schematic representation of an embodiment of a magnetic resonance tomography unit 1, in which the peripheral device is a local coil (50).

In this embodiment, the magnetic resonance tomography unit 1 includes multiple light emitters 71 that are distributed over an inner surface of the patient tunnel 16 or illuminate a light-scattering surface from the outside so that shadowing of an optical signal emitted by the light emitters 71 is avoided at the local coil 50. Herein, the light emitters 71 may be LEDs or semiconductor lasers that receive an electrical signal from the optical transmitter 70 and convert this into the optical signal and emit it into the patient tunnel 16. However, it would also be conceivable that an LED emitter or semiconductor laser in the optical transmitter 70 already performs conversion into light and for this to be guided to the patient tunnel 16 via glass fibers and optionally optical splitters. Glass fiber ends are arranged in the patient tunnel 16 as light emitters 71.

Figure 3:
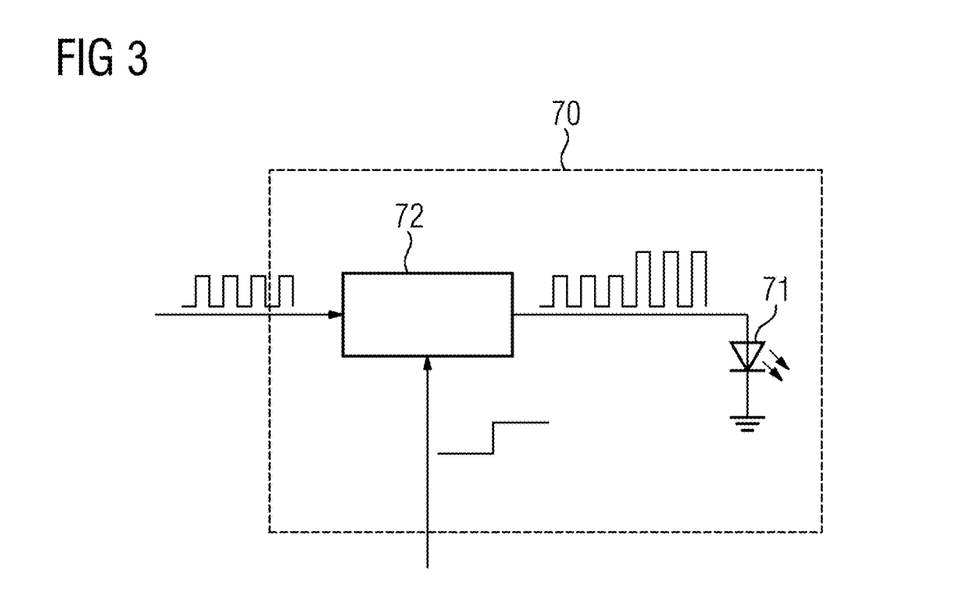
FIG. 3 depicts a schematic representation of an embodiment of an optical transmitter of a magnetic resonance tomography unit.

FIG. 3 depicts an embodiment of an optical transmitter 70 of a magnetic resonance tomography unit 1.

The optical transmitter 70 includes an amplitude modulator 72, that modulates a radio-frequency clock signal with a low-frequency control signal. For example, the amplitude modulator may have a multiplier that multiplies the clock signal with a low-frequency control signal. Modulation of the clock signal may be phase-synchronous, i.e., with a rising or falling edge of the clock signal. This may, for example, be achieved by switching the control signal through to the multiplier via a sample and hold element, wherein the sample and hold element is controlled by the clock signal, for example, it switches through at a low level of the clock signal.

An output signal from the amplitude modulator is output directly or via an output stage to one or more LEDs or LED emitters or semiconductor lasers for conversion into an optical signal.

Figure 4:
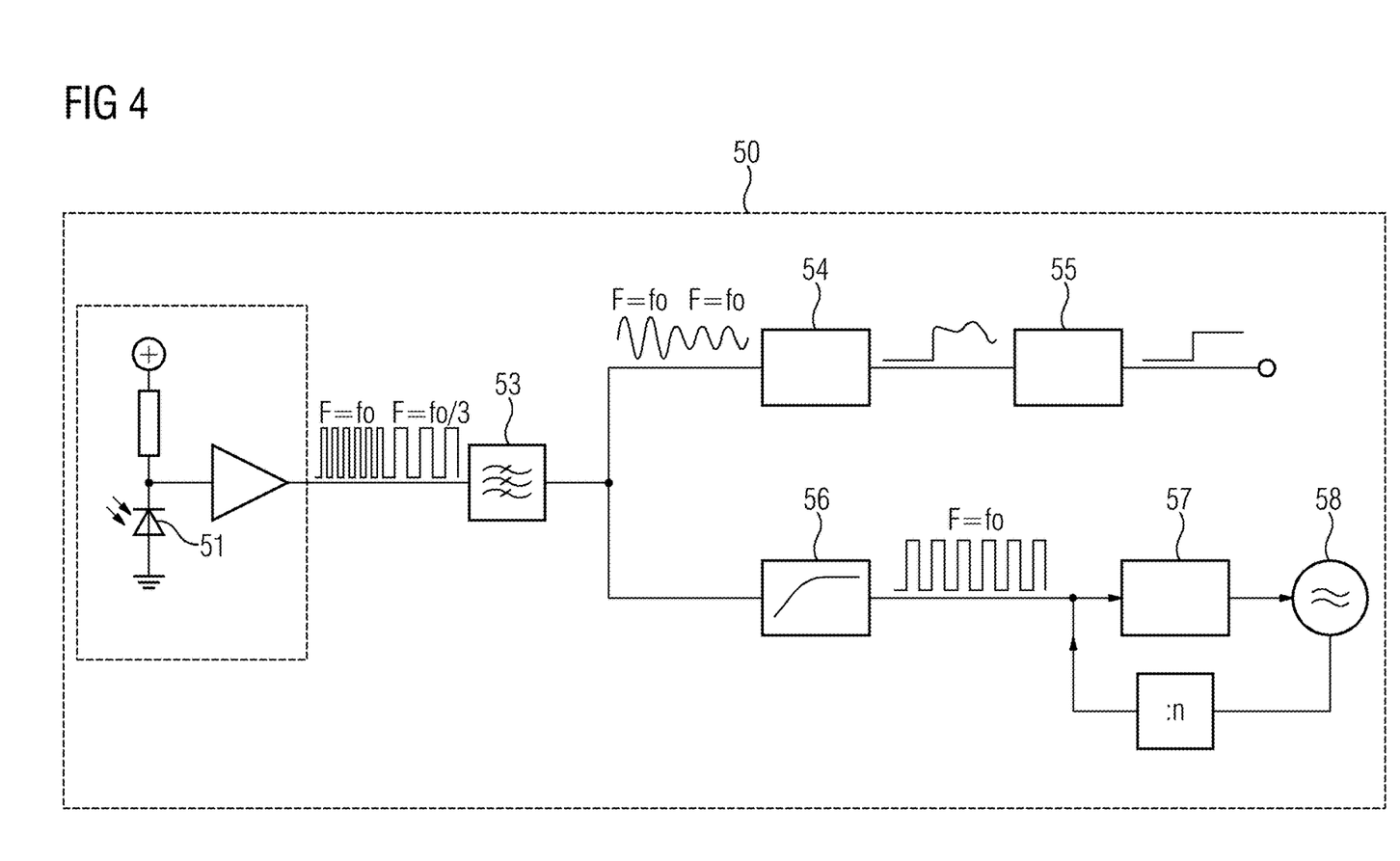
FIG. 4 depicts a schematic representation of components for recovering a clock signal of a peripheral device according to an embodiment.

FIG. 4 depicts an embodiment with components of the peripheral device 80 that are involved in the transfer or recovery of the clock signal and control signal. Other elements of the peripheral device 80 are not shown for the sake of clarity.

A first optical sensor 51, for example, a photodiode with a preamplifier, converts the optical signal into an electrical signal. A filter 53, for example, a bandpass filter or low-pass filter, allows a signal with a frequency of the clock signal to pass and attenuates signals with other frequencies, for example by more than 24 dB, 30 dB, 36 dB.

The filtered signal is fed to an amplitude demodulator 54 in a demodulation branch in order to recover the control signal modulated onto the clock signal. In the simplest case, the amplitude demodulator 54 may include a diode as a rectifier and a low-pass filter or buffer capacitor.

The demodulated signal still exhibits fluctuations, caused, for example, by changing shadows on the propagation path. These fluctuations are compensated by a compensation circuit 55, that is explained below in connection with FIG. 7.

The filtered signal is also fed in parallel into a branch of the circuit that is used to generate a stable master clock for the peripheral device 80. Herein, the filtered signal from the first sensor 51 is first amplified in a limiting amplifier 56 such that the amplitude fluctuations are eliminated by the amplitude limiting and only the carrier wave phase information remains. In a PLL circuit (phased lock loop control circuit), this stabilizes the frequency and phase of a VCO 58 (voltage-controlled oscillator), for example a crystal-stabilized VCO. The output signal from the VCO 58, or a signal derived therefrom is the master clock for the peripheral device 80.

Figure 5:
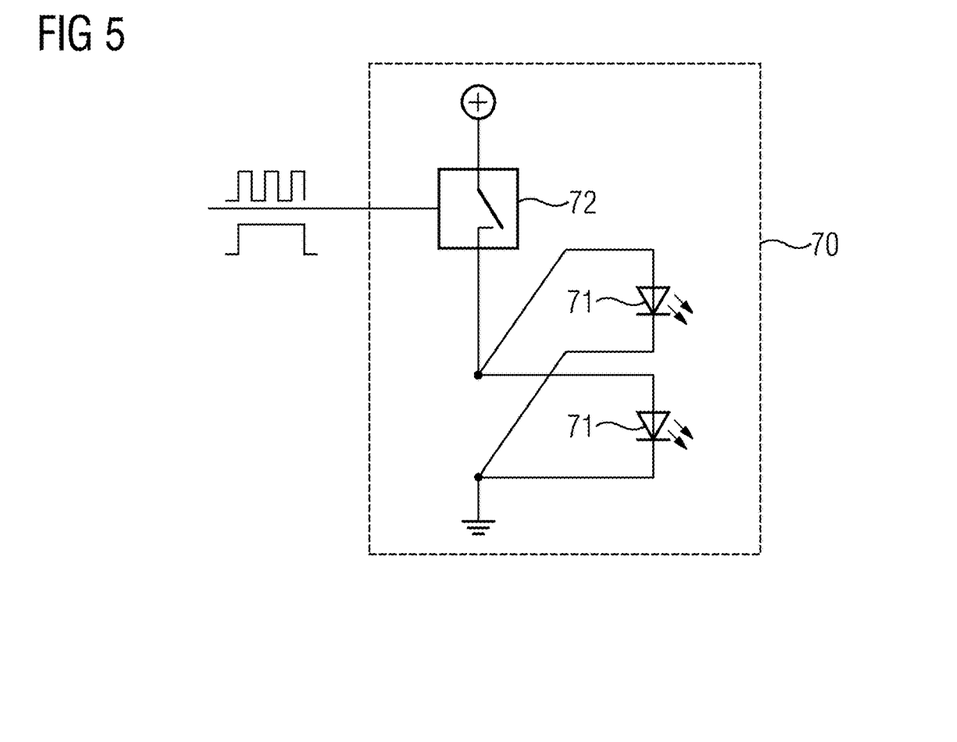
FIG. 5 depicts a schematic representation of an embodiment of an optical transmitter of a magnetic resonance tomography unit.

FIG. 5 depicts an embodiment of the optical transmitter 70. This embodiment is based on the idea that square-wave signals have harmonic components whose frequency corresponds to an odd multiple of the fundamental frequency. Here, the input signals of the optical transmitter are depicted by way of example as a high-frequency square-wave signal, also called the first modulation frequency, for example, 10 MHz, and a low-frequency square-wave signal or second modulation frequency of (10/3) MHz, i.e., approximately 3.33 MHz. The control unit 20 provides these signals with high accuracy derived from a stable master clock. Therefore, even if the optical transmitter 70 radiates an optical signal with the second modulation frequency, this then has frequency components with the first modulation frequency of 10 MHz.

When clocked by the first modulation signal or the second modulation signal, the optical transmitter switches the power supply for the LED or a semiconductor laser as a light emitter 71 or light source on and off by an electronic switch and in this way generates an optical signal modulated with the square-wave signal. A plurality of light emitters 71 are switched at the same time in order to avoid shadowing of the sensor 51. Alternatively, it is possible for a wall or a reflector on the magnetic resonance tomography unit 1 to be configured to scatter light and be illuminated by one or more light emitters 71. Advantageously, modulation with a square-wave signal by a switch is simple to implement and more efficient than linear intensity modulation.

Herein, due to the change between the first modulation frequency and the second modulation frequency, because of the harmonics, a signal component with the first modulation frequency is always also available and this is selected by the filter 53 in the peripheral device 80. Since the harmonic components always have a lower amplitude than the fundamental wave, the change between the modulation frequencies leads to amplitude modulation in a spectral range of the first modulation frequency, that, for example, may be evaluated with the peripheral device 80 shown in FIG. 4. If the signals of the first modulation frequency and second modulation frequency are in a phase-stable relationship, in that the edges of the signal with the second modulation frequency are synchronous with edges of the signal with the first modulation frequency, the clock signal generated via a PLL is not disrupted by frequency shift keying. This may, for example, be achieved by obtaining the second modulation frequency from the first modulation frequency by phase-synchronous frequency division.

Figure 6:
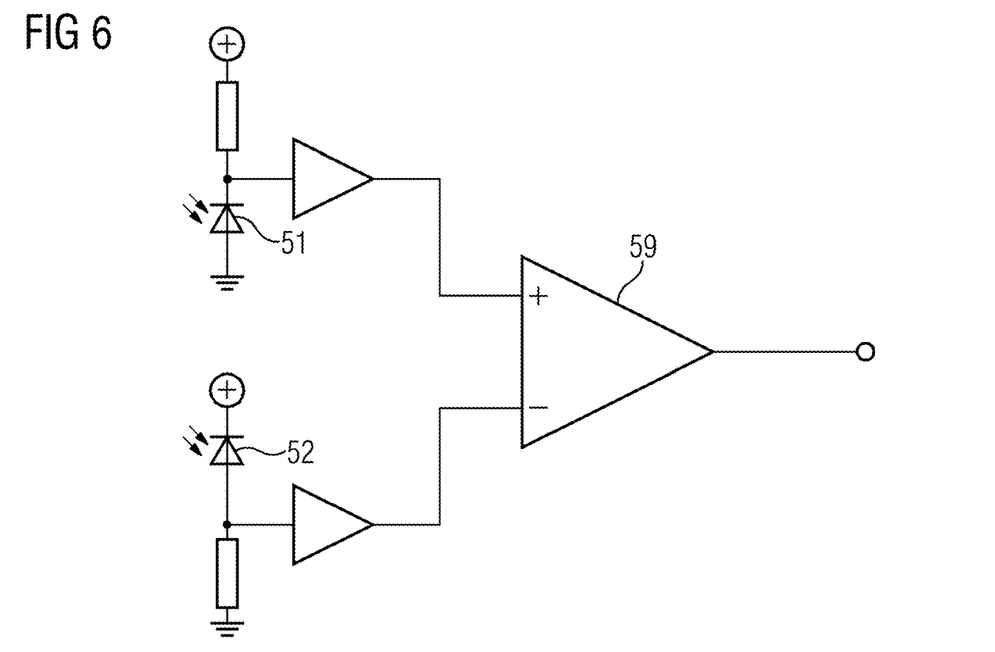
FIG. 6 depicts a schematic representation of a combination of sensors of a peripheral device according to an embodiment.

FIG. 6 is a schematic view of a combination of a first sensor 51 and a second sensor 52 for detecting the optical signal. The combination for example reduces electromagnetic interference to the reception of the optical signal caused by the operation of the magnetic resonance tomography unit.

For this purpose, the first sensor 51 and the second sensor 52 are arranged adjacent to one another in order to minimize induction in connecting lines and to expose both sensors 51, 52 to electromagnetic fields that are as equal as possible. The distance may be less than 2 cm, 1 cm, or 5 mm.

Herein, in FIG. 6, the first sensor 51, here a photodiode, is directly connected to the positive supply voltage in the reverse direction, while the connection to ground potential takes place via a resistor.

For the second sensor 52, the roles of resistor and sensor are reversed, i.e., the resistor is directly connected to the positive supply voltage and the second sensor 52 to the ground potential. Reversing the arrangement causes an identical optical signal in the two sensors 51, 52 to generate an electrical signal with a comparable amplitude, but an opposite sign.

The electrical signal generated by the sensors 51, 52 is amplified and fed to a differential amplifier 49 at the inverting or non-inverting input. Advantageously, due to the different sign, the electrical signals caused by the optical signal at the sensors 51, 52 are added together at the output of the differential amplifier 59. On the other hand, electromagnetic interference induces interference signals with the same sign in both branches, so that these essentially cancel each other out in the differential amplifier. At the same time, the signal-to-noise ratio of the composite signal is 3 dB greater than that of the individual signals, since the noise contributions of the electrical components are uncorrelated are and are thus added together in terms of power, while the correlated received signals are added together in terms of voltage.

Figure 7:
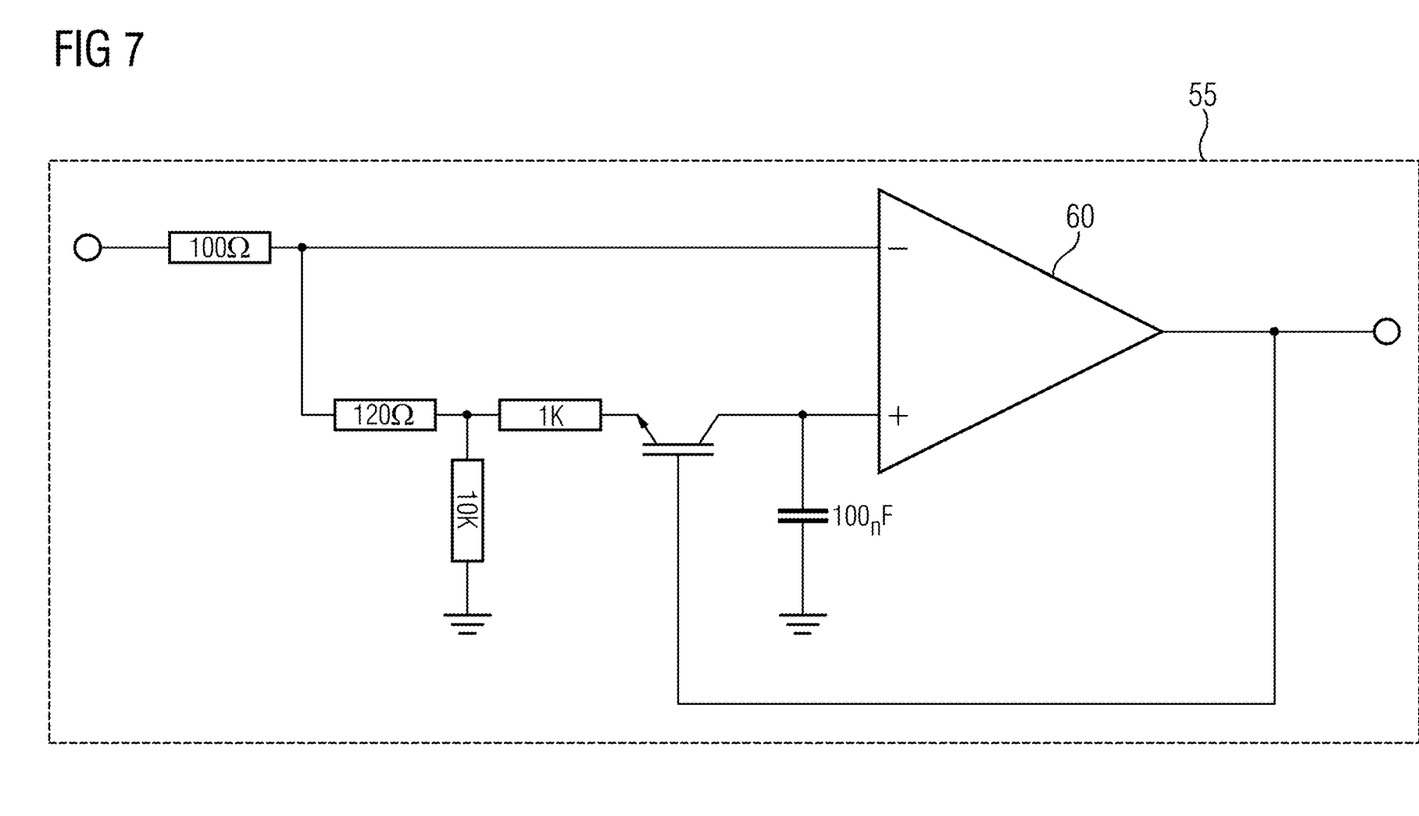
FIG. 7 depicts a schematic representation of a compensation circuit of a possible embodiment of a peripheral device according to an embodiment.

FIG. 7 is a schematic depiction of an embodiment of a compensation circuit 55. The filtered and demodulated sensor signal is fed to the inverting input of a comparator 60. At the same time, the sensor signal is reduced by a resistive voltage divider, low-pass filtered via an RC element and fed to the not-inverting input of the comparator 60. The capacitor of the RC element also serves as the charging capacitor of a track-and-hold element with an electrical switch that is embodied here as a MOS-FET. Herein, the track and hold element is actuated by the output of the comparator 60, so that the switch of the track and hold element is opened when the sensor signal becomes smaller than the reference signal.

Figure 8:
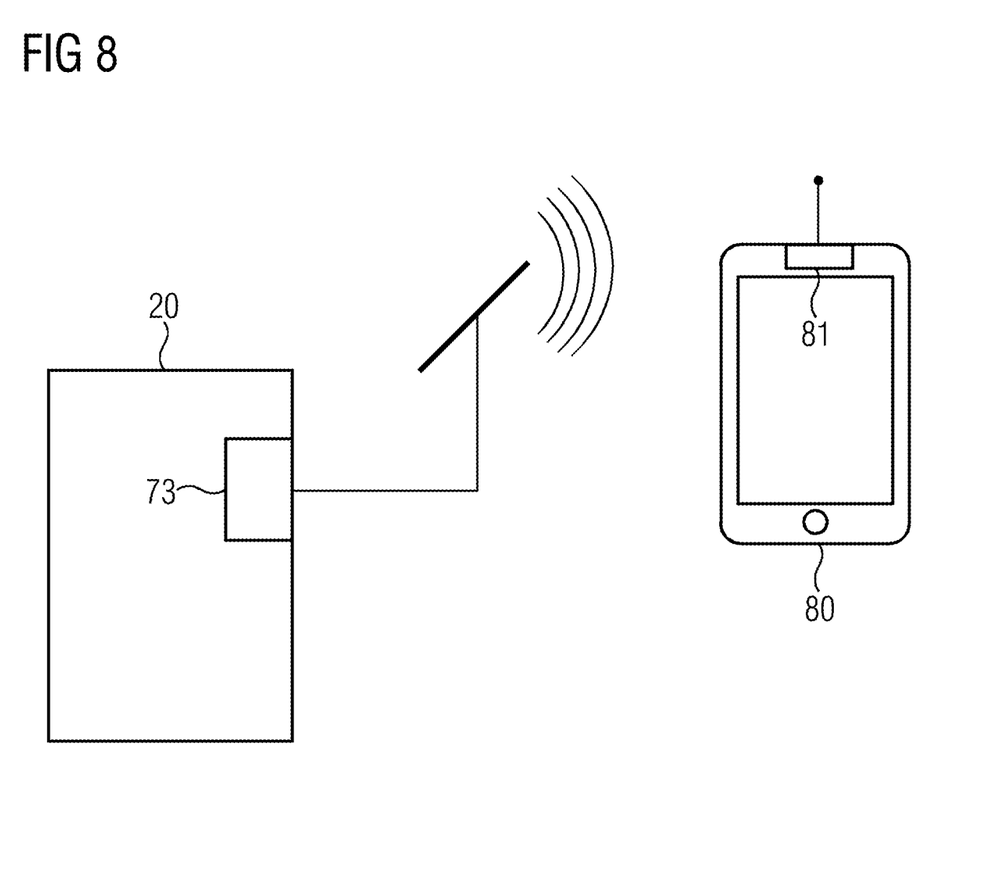
FIG. 8 depicts a schematic representation of a transmitter of an embodiment of the magnetic resonance tomography unit.

FIG. 8 depicts a magnetic resonance tomography unit 1 and a peripheral device 80, that, instead of an optical signal, use a radio wave for transferring the electromagnetic data signal or the first modulation frequency. For this purpose, the control unit 20 has a transmitter 73 for emitting a radio wave. An oscillator generates a radio-frequency signal with a frequency higher than the Larmor frequency when imaging nuclear spins to be detected with the magnetic resonance tomography unit 1 in the static magnetic field of the magnetic resonance tomography unit 1. For example, the frequency of the radio-frequency signal may be greater than twice, five times or ten times the Larmor frequency. The frequency may be less than 100 GHz, 50 GHz, or 10 GHz.

The transmitter 73 modulates the radio-frequency signal with a clock signal and/or control signal for the peripheral device and emits it via an antenna as a radio wave in an environment of the magnetic resonance tomography unit 1 in which peripheral devices 80 are located. It is also conceivable for the frequency to correspond to a multiple of the clock frequency to be transferred, that is obtained from the clock signal by a frequency multiplier.

The peripheral device receives the radio wave with a receiver 81. Herein, the clock signal and/or control signal to be transferred may be obtained by the peripheral device 80 by demodulation of the radio wave as already described for the output signal from the sensor 51, 52 with respect to FIGS. 3 and 4. If the frequency of the radio wave or the radio-frequency signal is a multiple of the clock signal to be transferred, it is also conceivable for the clock signal to be recovered by frequency division.

The peripheral device 80 uses the recovered clock signal as a master clock for internal signal processing. Thus, as already described, it is also ensured that interference frequencies generated by the signal processing and their harmonics do not lie on signal frequencies of the magnetic resonance signals.

Figure 9:
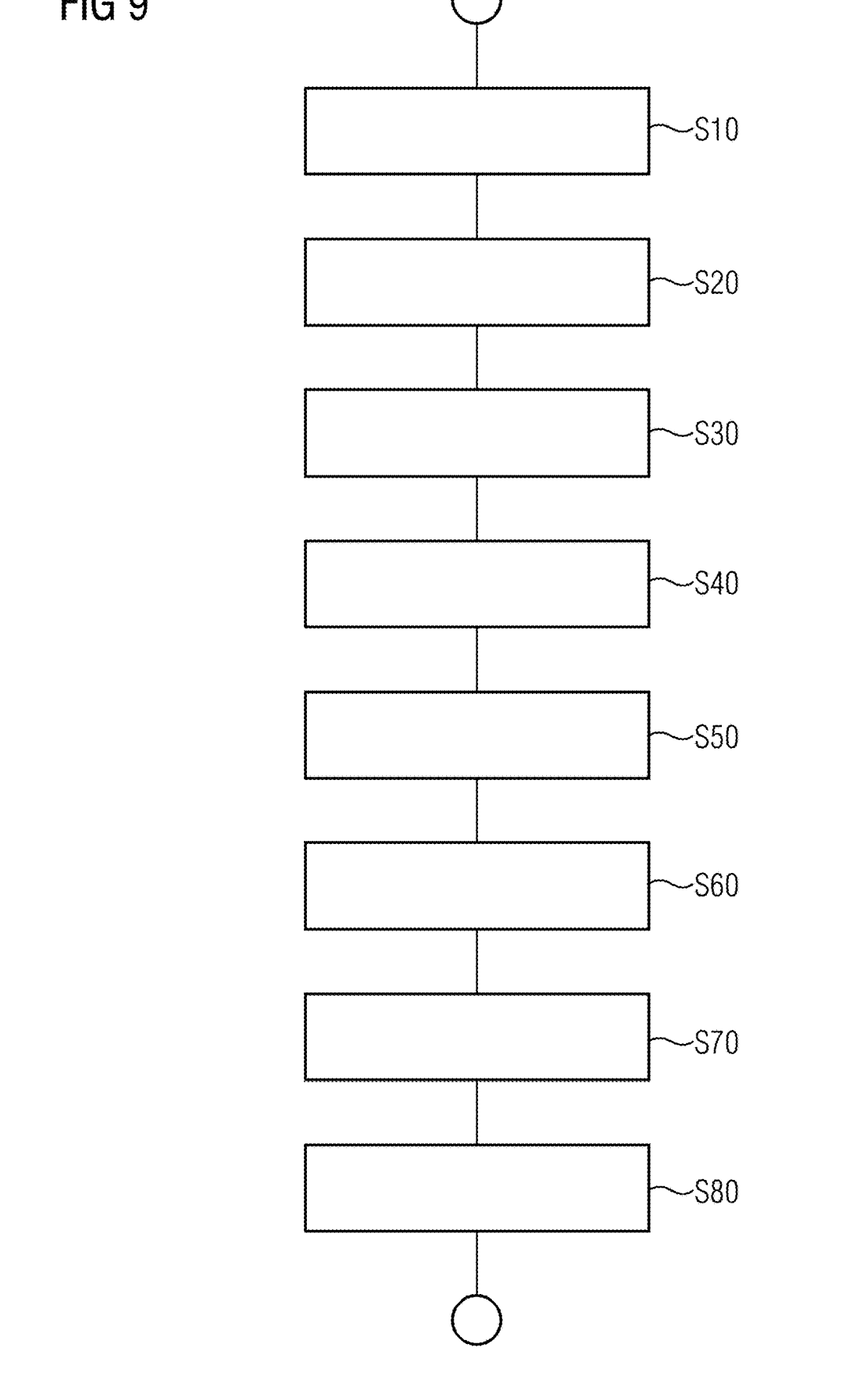
FIG. 9 depicts a schematic flow diagram for a method.

FIG. 9 shows a schematic flow diagram of a method for the wireless transfer of a clock signal and a control signal with a magnetic resonance tomography unit.

In a step S10, an electromagnetic data signal is modulated at a first modulation frequency. For example, an electronic switch that connects one or more LEDS to a supply voltage may be switched on and off by the control unit 20 at the first modulation frequency. The LED then emits an optical signal modulated at the first modulation frequency. However, it is also conceivable that, in a transmitter 73, a radio-frequency signal with a frequency in the radio-wave range is switched on and off or switched between two amplitude values and radiated via an antenna into an environment of the peripheral device 80 as a radio wave.

In a further step S20, a first sensor 51, for example, a photodiode, receives the optical signal and converts it into an electrical signal, also called the first output signal. It is also conceivable for the electrical signal to be amplified and/or combined with electrical signals from other sensors. However, the first sensor may also be a receiver for radio waves and output a first output signal that depends, for example proportionally, on the field strength of the radio signal. This may, for example, be achieved by rectifying with a diode and filtering the received radio signal or an intermediate frequency generated therefrom with a buffer filter. Herein, the buffer filter, for example an RC element, has a frequency response configured to keep the output voltage substantially constant between two half-waves of the radio-frequency signal or the intermediate frequency signal and has substantially the same throughput attenuation for both modulation frequencies mentioned below, for example, a difference in attenuation of less than 1 dB.

In another step S30, the first output signal from the first sensor is filtered by the bandpass filter. The bandpass filter includes a minimum pass-band attenuation at a frequency of the clock signal.

In another step S40, the electromagnetic data signal is modulated as in step S10, but at a second modulation frequency different from the first modulation frequency. Herein, a frequency of the clock signal is an odd multiple of the first and the second modulation frequency, wherein the multipliers differ at the first and second modulation frequency. For example, the multiplier at the first modulation frequency is equal to 1, so that the first modulation frequency corresponds to the frequency of the clock signal. The multiplier of the second modulation frequency may, for example, be 3, so the second modulation frequency is a third of the frequency of the clock signal. The electromagnetic data signal with the second modulation frequency is also, as described, emitted by the transmitter 73.

In a step S50, the electromagnetic data signal with the second modulation frequency is received, as already described with respect to step S20, with the first sensor 51 and converted into a third electrical output signal. Herein, the term second output signal is already used and preassigned for the output signal from the second sensor 52. However, in principle, it is also conceivable to use the method with a previously described combination of the first sensor 51 and second sensor 52 for interference suppression, wherein the term first output signal is applied accordingly to the combined output signal from the sensors at the first modulation frequency, analogously for the third output signal at the second modulation frequency.

In a step S60, a third output signal from the first sensor is filtered by the bandpass filter. Since the bandpass filter has minimum attenuation at the frequency of the clock signal, the bandpass filter allows a harmonic of the second modulation signal at the frequency of the clock signal to pass.

In a step S70, a receiver 81 of the peripheral device 80, stabilizes for example, by a PLL circuit, a clock frequency of an oscillator with the first output signal and the third output signal from the first sensor. This is made possible by the fact that the first modulation signal also has signal components that lie at the frequency of the clock signal and are forwarded by the bandpass filter.

In another step S80, a control signal is demodulated from the first output signal and the third output signal by an amplitude demodulator. The amplitude differences of the first and the third electrical output signal result from the fact that the signal components of harmonics decrease with increasing order.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A peripheral device for a magnetic resonance tomography unit, the peripheral device comprising:
   a first sensor configured to receive an optical data signal from an environment of the peripheral device;

a second sensor adjacent to the first sensor, wherein the first sensor is configured to generate a first output signal from the optical data signal and the second sensor is configured to generate a second output signal from the optical data signal, wherein the first output signal has an amplitude inverse to the second output signal;

an inverter configured to invert the first output signal from the first sensor; and a summing element configured to add the inverted first output signal from the first sensor and the second output signal from the second sensor to a sensor signal;

wherein the peripheral device is configured to execute signal processing in dependence on the optical data signal;

wherein a frequency of the optical data signal is greater than a Larmor frequency of the magnetic resonance tomography unit.

2. The peripheral device of claim 1, wherein the peripheral device is a local coil.

3. The peripheral device of claim 1, wherein the peripheral device further comprises:

a filter configured to select a modulation frequency of the sensor signal; and a narrow-band phase-lock loop circuit configured to stabilize an oscillator in dependence on the modulation frequency and a modulation phase.

4. The peripheral device of claim 1, wherein the peripheral device further comprises:

an amplitude demodulator with a compensation circuit configured to compensate a low-frequency signal component of the sensor signal compared to a modulation frequency of a modulation signal.

5. The peripheral device of claim 4, wherein the compensation circuit includes a comparator with a reference voltage input that includes a first signal connection to the sensor signal via a low-pass filter.

6. The peripheral device of claim 5, wherein the first signal connection has a track and hold element that is actuated in dependence on a differential voltage between the sensor signal and the reference voltage.

7. A magnetic resonance tomography unit comprising:

a tomography unit comprising an optical transmitter configured to transfer a clock signal, a control signal, or the clock signal and the control signal by open-air optical transfer of an optical signal to a peripheral device in an environment of the magnetic resonance tomography unit, wherein the optical transmitter is configured to modulate the optical signal at a modulation frequency in order to transfer the control signal and the clock signal, wherein the magnetic resonance tomography unit is configured to change a modulation frequency from a first modulation frequency to a second modulation frequency unequal to the first modulation frequency in order to transfer the control signal;

wherein a frequency of the optical signal is greater than a Larmor frequency of the magnetic resonance tomography unit.

8. The magnetic resonance tomography unit of claim 7, wherein the optical transmitter comprises an amplitude modulator configured to synchronously execute a change of an amplitude for modulation of the optical signal for transferring the clock signal and the control signal.

9. The magnetic resonance tomography unit of claim 7, wherein a frequency of the clock signal is an odd multiple of the modulation frequency.

10. The magnetic resonance tomography unit of claim 7, wherein the optical transmitter is configured to radiate the optical signal into an environment of the magnetic resonance tomography unit and to distribute the optical signal by scattering on a surface.

11. A method for wireless transfer of a clock signal and a control signal with a magnetic resonance tomography unit, the method comprising:

modulating an electromagnetic data signal at a first modulation frequency and transmitting a first modulated electromagnetic data signal with a transmitter;

receiving the electromagnetic data signal with a first sensor;

filtering a first output signal from the first sensor with a filter;

modulating the electromagnetic data signal at a second modulation frequency and emitting a second modulated electromagnetic data signal with the transmitter;

receiving an optical signal with the first sensor;

filtering a third output signal from the first sensor with the filter;

stabilizing a clock frequency of an oscillator with the first output signal and the third output signal from the first sensor; and demodulating a control signal from the first output signal and the third output signal by an amplitude demodulator;

wherein a frequency of the clock signal is an odd multiple of the first modulation frequency and the second modulation frequency.

12. A magnetic resonance tomography unit comprising:

a tomography unit comprising an optical transmitter configured to transfer a clock signal, a control signal, or the clock signal and the control signal by an open-air optical transfer of an optical signal to a peripheral device in an environment of the magnetic resonance tomography unit;

wherein the optical transmitter comprises an amplitude modulator configured to synchronously execute a change of an amplitude for modulation of the optical signal for transferring the clock signal and the control signal, wherein modulation of the clock signal is phase-synchronous with a rising or falling edge of the clock signal;

wherein a frequency of the electromagnetic data signal is greater than a Larmor frequency of the magnetic resonance tomography unit.

* * * * *